(12) United States Patent
Yamamoto et al.

(10) Patent No.: US 6,438,035 B2
(45) Date of Patent: Aug. 20, 2002

(54) NONVOLATILE SEMICONDUCTOR STORAGE DEVICE

(75) Inventors: Kaoru Yamamoto; Nobuhiko Ito, both of Tenri; Yoshimitsu Yamauchi, Nabari, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/880,114

(22) Filed: Jun. 14, 2001

(30) Foreign Application Priority Data

Jun. 15, 2000 (JP) ........................................ 2000-179840

(51) Int. Cl.⁷ ............................................. G11C 16/06
(52) U.S. Cl. .............................. 365/185.21; 365/185.22
(58) Field of Search ........................ 365/185.21, 185.2, 365/185.22, 185.03

(56) References Cited

U.S. PATENT DOCUMENTS

| 5,422,854 A | * | 6/1995 | Hirano et al. ........... 365/185.21 |
| 5,594,691 A | * | 1/1997 | Bashir .................... 365/185.03 |
| 5,959,919 A | * | 9/1999 | Choi ............................ 327/52 |

FOREIGN PATENT DOCUMENTS

| EP | 0752721 | 1/1997 |
| JP | A-9-92739 | 4/1997 |

OTHER PUBLICATIONS

"A Quick Intelligent Program Architecture for 3V–only NAND–EEPROMS", Symposium on VLSI Circuits Digest of Technical Papers pp. 20–21, 1992.

* cited by examiner

Primary Examiner—Hoai V. Ho
(74) Attorney, Agent, or Firm—Morrison & Foerster, LLP

(57) ABSTRACT

There is provided a nonvolatile semiconductor storage device capable of securing sufficient read accuracy without providing superfluous sense time margin when there are variations in temperature and transistor characteristics. This nonvolatile semiconductor storage device includes a reference cell 2 whose threshold value is preparatorily set to a value between a lower limit of a threshold voltage distribution in a state 0 in which nonvolatile memory cells MC00 through MC12 have a high threshold value and an upper limit of a threshold voltage distribution in a state 1 in which the memory cells have a low threshold value. When the characteristics of the nonvolatile memory cells MC00 through MC12 shift due to the influence of a change in temperature or the like, the characteristics of the reference cell 2 shift so as to follow this characteristic shift. The operation timing of a sense amplifier section 8 in read operation is generated by a control circuit, and the timing of the termination of the sense operation from among the operation timing is determined by timing control circuit (delay circuit delay and AND circuits AN0 and AN1) with the termination of the sense of the reference cell 2.

14 Claims, 10 Drawing Sheets

READ AND VERIFY

WRITE

ERASE

NONVOLATILE SEMICONDUCTOR STORAGE DEVICE

BACKGROUND OF THE INVENTION

The present invention relates to nonvolatile semiconductor storage devices and, in particular, to a nonvolatile semiconductor storage device that can achieve improved accuracy of read operation and verify operation during rewrite.

In recent years, a large-capacity flash memory has been developed for the markets of memory cards and files. For the above uses, the flash memory is required to have high-speed read and high-speed rewrite functions at a high density and a reduced cost.

As a nonvolatile semiconductor storage device having the above-mentioned functions, there has been proposed a read/rewrite circuit construction of a NAND type flash memory by Symposium on VLSI Circuits Digest of Technical Papers pp. 20–21, 1992.

FIG. 11 shows the construction of the read/rewrite circuit of the above-mentioned NAND type flash memory.

This circuit has an open bit line structure with one centered read/write circuit 111, and verify circuits 112 and 113 are connected to each of the bit lines BLai and BLbi. The read/write circuit 111 operates as a flip-flop type sense amplifier in the read operation and the verify operation during rewrite and as a data latch circuit in the write operation. The control gate of a memory cell 204 is connected to an identical word line for every cell to be concurrently subjected to write.

Herein is mainly provided a description of the read operation and the verify operation during rewrite related to the present invention. In order to set the threshold voltage of the memory cell to a specified value in the write operation (or the erase operation), this verify operation during rewrite is to alternately execute the applying of a write pulse (or an erase pulse) and the verify operation. This verify operation during rewrite is basically the same as the read operation, while the threshold voltage value to be detected is changed.

The timing chart of FIG. 12 shows the timing of the read operation in the aforementioned NAND type flash memory. The timing chart of FIG. 12 shows an example in which the memory cell array (a) side is selected and the memory cell 204 is selected and subjected to read. A power voltage Vcc is assumed to be 3 V.

First of all, a voltage of ⅗ Vcc (1.8 V) is applied to a terminal Va, and a voltage of ½ Vcc (1.5 V) is applied to a terminal Vb.

Both control signals φpa and φpb to the gates of the transistors Tr1 and Tr2 have High level, and therefore, the transistors Tr1 and Tr2 are in the ON state. Accordingly, the potential of a selected bit line BLai is precharged with the voltage of ⅗ Vcc. On the other hand, the potential of a non-selected bit line BLbi, which is used as a dummy bit line for the open bit line system, is precharged with a voltage of ½ Vcc.

Then, the transistors Tr1 and Tr2 are put into the OFF state as shown in a period of t1 to t2 in FIG. 12. Subsequently, by making both control signals SG1 and SG2 to the gates of select transistors S1 and S2 have High level, both the transistors S1 and S2 are put into the ON state. Then, non-selected word lines CG1 through CG3 and CG5 through CG8 are set to the Vcc level, while a word line CG4 connected to the control gate of the selected memory cell 204 (to be subjected to read) is set to 0 V. In this stage, if the threshold voltage of the selected memory cell 204 is lower than 0 V (when the data of the memory cell 204 is "0"), then a current flows through the memory cell 204. Other memory cells having control gates (CG1 through CG3 and CG5 through CG8) to which the power voltage Vcc is applied are put into a state in which a cell current flows.

As described above, the current flows through the memory cell connected continuously to the memory cell 204, and therefore, the potential of the selected bit line BLai reduces to ½ Vcc level or less as indicated by the potential waveform "0"-read of the bit line BLai shown in FIG. 12 and continues to reduce.

Conversely, when the threshold voltage of the selected memory cell 204 is higher than 0 V (data of the memory cell 204 represents "1"), no cell current flows through the memory cell 204. Therefore, no current flows through the memory cell 204 even if the power voltage Vcc is applied to the control gates CG1, CG2, CG3 and CG5 through CG8 of other memory cells. Therefore, the potential of the selected bit line BLai does not reduce as indicated by the potential waveform "1"-read of BLai shown in FIG. 12, and ⅗ Vcc level is maintained. On the other hand, since no cell current flows as described above, the potential of the non-selected bit line BLbi, which is used as a dummy bit line here, maintains the ½ Vcc level.

When the threshold voltage of this memory cell 204 is lower than 0 V, the select transistors S1 and S2 are put in the OFF state and the non-selected word lines CG1 through CG3 and CG5 through CG8 are set to 0 V in accordance with a timing at which the potential of the selected bit line BLai sufficiently reduces and becomes 0 V as shown in a period of t2 to t3 (potential waveform "0"-read) in FIG. 12.

According to the description provided by way of example in FIGS. 11 and 12, the timing at which the potential reaches 0 V is merely of the operation of the memory cells 204 connected to the bit line BLai. However, even in the case of another memory cell or a memory cell connected to another bit line, the above-mentioned timing is the timing at which the selected bit line comes to have a voltage of 0 V when the data of the selected memory cell represents "0".

Subsequently, both transistors TR3 and TR4 are put in the OFF state by control signals φp and φn to the gates of the transistors TR3 and TR4 provided on the power source side of the read/write circuit 111 in a period of t4 to t5 through the stable period of t3 through t4 in the circuit state shown in FIG. 12. By this operation, the read/write circuit 111 is reset and put into a floating state.

Subsequently, the control signal φe is made to have High level to turn on the transistors Tr5 and Tr6 and set (equalize) the potentials of a node a and a node b to a voltage of ½ Vcc. When this equalization is ended as in the period of t5 through t6 of FIG. 12, the control signal φe is set to 0 V to set back the transistors Tr5 and Tr6 to the OFF state.

When the transistors Tr7 and Tr8 are put in the ON state by making the clock signals φa and φb have High level, the bit line BLai is connected to the node a, and the bit line BLbi is connected to the node b.

By this operation, when the data of the memory cell 204 represents "0", the bit line BLai of a potential of 0 V and the node a of the potential of ½ Vcc are connected to each other, and the potential of the node a starts to reduce from ½ Vcc to 0 V. When the data of the memory cell 204 represents "1", the bit line BLai of the potential of ⅗ Vcc and the node a of the potential of ½ Vcc are connected to each other, and the potential of the node a starts to increase from ½ Vcc to ⅗ Vcc.

The non-selected bit line BLbi of the potential of ½ Vcc is also connected to the node b of the potential of ½ Vcc, and therefore, the potential of the node b maintains the potential of ½ Vcc (period of t6 to t7 of FIG. 12).

Subsequently, the transistor Tr4 provided on the ground voltage side of the read/write circuit 111 is turned on in a period subsequent to t7 of FIG. 12, and the transistor Tr3 provided on the power source Vrw side is subsequently turned on.

At this time, the potential of the node b is ½ Vcc. When the data of the memory cell 204 represents "1", the potential of the node a is higher than the voltage of ½ Vcc. Conversely, when the data of the memory cell 204 represents "0", the potential is lower than the voltage of ½ Vcc. Therefore, when the data of the memory cell 204 represents "1", the flip-flop type read/write circuit 111 sets the node a at Vrw level and latches (senses) the node b at 0 V level.

Conversely, when the data of the memory cell 4 represents "0", the read/write circuit 111 latches the node a at 0 V level and latches (senses) the node b at Vrw level.

When the transistors Tr9 and Tr10 are turned on by a signal from a column decoder 115, this sensed data is outputted from terminals 10A and 10B. This read is executed according to a page mode sequence.

According to the aforementioned prior art, it is required to establish the operation timing of the sense amplifier (read/write circuit 111) as shown in FIG. 12 by a control circuit or the like inside a chip in each of the read operation and the verify operation during rewrite as described above. Normally, this control circuit generates a timing signal of the sense operation in synchronization with a clock signal generated by an oscillator or the like inside the chip.

However, the frequency and so on of the circuit of the oscillator or the like have considerable variations due to the temperature and transistor characteristics, in accordance with which the timing signal also varies to reduce the read accuracy.

Moreover, since the threshold voltage of the cell varies depending on the temperature, and therefore, a threshold voltage distribution also varies. Therefore, it is required to provide a sufficient time margin in the sense operation in order to keep sufficient read accuracy.

SUMMARY OF THE INVENTION

Accordingly, the object of the present invention is to provide a nonvolatile semiconductor storage device capable of securing sufficient read accuracy without providing a sufficient sense time margin by logically generating the operation timing by a control circuit even when variations in temperature and transistor characteristics occur.

In order to achieve the aforementioned object, the present invention provides a nonvolatile semiconductor storage device including a plurality of word lines and a plurality of bit lines; a memory cell array where nonvolatile memory cells each having a control gate connected to one of the plurality of word lines and a drain connected to one of the plurality of bit lines are arranged in an array form; a sense amplifier section for amplifying data read on the bit line; a precharge circuit for precharging the bit line with a specified voltage; and a reference cell whose threshold value is preparatorily set to a specified value, the nonvolatile semiconductor storage device executing data read or verify of rewrite data by precharging the bit line with the specified voltage by means of the precharge circuit, applying a specified read voltage or specified verify voltage to a selected word line and determining by means of the sense amplifier section whether or not the bit line is discharged by the selected nonvolatile memory cell, and the nonvolatile semiconductor storage device comprising:
 a bit line connected to the reference cell;
 a sense circuit connected to the bit line of the reference cell for detecting a timing in which discharge of the bit line of the reference cell is completed; and
 a timing control means for starting sensing the reference cell concurrently with starting sensing the selected nonvolatile memory cell, causing the sense circuit to detect a timing in which discharge of the bit line of the reference cell is completed and controlling sense operation termination timing of the sense amplifier section connected to the memory cell array on the basis of the detected timing of completion.

According to the present invention, when the characteristic of the nonvolatile memory cell shifts due to the influence of a temperature change or the like, the characteristic of the reference cell shifts so as to follow the shift of this characteristic. According to the present invention, the sense operation ending timing of the operation timing of the sense amplifier section in the read operation or verify operation is determined by the timing control means with the termination of the sense of the reference cell.

Therefore, according to the nonvolatile semiconductor storage device of the present invention, the relative read level of the nonvolatile memory cell does not change even if the characteristic of the nonvolatile memory cell shifts due to the influence of the temperature change or the like, and this obviates the need for providing a superfluous margin and allows high-accuracy read operation or verify operation to be achieved.

In one embodiment, the threshold value of the reference cell is the specified value between a lower limit of a threshold voltage distribution in a state in which each nonvolatile memory cell has a high threshold value and an upper limit of a threshold voltage distribution in a state in which each nonvolatile memory cell has a low threshold value, and
 the data read is executed by applying the specified read voltage to the selected word line.

In one embodiment, the threshold value of the reference cell is a write verify voltage or an erase verify voltage of the nonvolatile memory cell, and
 the verify of the rewrite data is executed by applying the verify voltage to the selected word line.

In one embodiment, the nonvolatile memory cells assume at least two states with respect to threshold voltage distribution thereof, and
 the threshold voltage of the reference cell is set approximately at the middle of a lower limit of a threshold voltage distribution in a state in which the threshold voltages of the nonvolatile memory cells are high and an upper limit of a threshold voltage distribution in a state in which the threshold voltages of the nonvolatile memory cells are low.

According to this embodiment, when the threshold voltage of the nonvolatile memory cell shifts due to the temperature change or the like, the threshold voltage of the reference cell changes similarly to this change. Therefore, by setting the threshold voltage of the reference cell to a threshold voltage approximately at the middle of the upper limit of the one state and the lower limit of the other state of the memory cell array as in this embodiment, the relative read level of the memory cell can be made unchangeable.

Therefore, according to this embodiment, there is no need for providing a superfluous margin for the sense timing during read, and this allows a high-accuracy read operation to be achieved.

Moreover, according to the present embodiment, the threshold voltage of the reference cell is set to a threshold voltage approximately intermediate between the upper limit and the lower limit of each state of the nonvolatile memory cells. For example, the threshold voltage of the reference cell takes a margin from the threshold voltage distribution in the state 0 and the threshold voltage distribution in the state 1. Therefore, even when the distribution of the threshold voltages of the nonvolatile memory cells is spread by disturb during rewrite, the threshold voltage of the reference cell does not overlap the threshold voltage of the nonvolatile memory cell, and a margin still exists. Therefore, the nonvolatile memory cell can surely be read, and reliability can be secured.

For example, in the case of a binary expression with the state 0 defined as a state in which the threshold voltages of the nonvolatile memory cells are high and the state 1 defined as a state in which the threshold voltages are low, the threshold voltage of the reference cell is set approximately at the middle of those states. Since the nonvolatile memory cell in this state 0 has a threshold voltage higher than that of the reference cell. Therefore, in the case where the discharge of the nonvolatile memory cell is terminated at the point of time when the discharge of the reference cell is ended in the read operation, the amount of current that can be flowed from this nonvolatile memory cell is smaller than the amount of current that can be flowed from the reference cell. Therefore, at the point of time when the discharge of the reference cell is terminated, the sense operation of the nonvolatile memory cell has not been terminated. However, since the memory cell in the state 1 has a threshold voltage lower than that of the reference cell, the amount of the current that can be flowed from the nonvolatile memory cell is larger than that of the reference cell. Therefore, in the memory cell in the state 1, the sense has been terminated at the point of time when the sense of the reference cell is ended.

In one embodiment, the nonvolatile memory cells assume at least two states with respect to threshold voltage distribution thereof, and the threshold voltage of the reference cell is set at upper limit of a threshold voltage distribution in a state in which the threshold voltages of the nonvolatile memory cells are low.

In this embodiment, for example, a nonvolatile memory cell has a binary expression with the state 0 defined as a state in which the threshold voltage of the nonvolatile memory cell is high and the state 1 defined as a state in which the threshold voltage is low, and the threshold voltage of the reference cell is set at the upper limit of the distribution of the threshold voltage of the state 1. It is to be noted that the operation to lower the threshold voltage of the nonvolatile memory cell from the state 0 to the state 1 is assumed to be the write operation.

In the case where the sense of the nonvolatile memory cell is terminated when the sense of the reference cell is ended in the write verify operation, the threshold voltage of the nonvolatile memory cell which has been put in the state 1 after the completion of write is lowered to a value lower than the threshold voltage of the reference cell. Therefore, this nonvolatile memory cell has a larger amount of current that can be flowed than in the reference cell, and the sense is terminated. However, the memory cell of which the write operation has not yet been terminated has a threshold voltage higher than that of the reference cell. Therefore, the current that can be flowed in the nonvolatile memory cell is smaller than in the reference cell, and the sense has not been terminated at the point of time when the sense of the reference cell is ended. Therefore, the write is executed again.

By thus setting the threshold voltage of the reference cell to the threshold voltage at the upper limit of the threshold voltage distribution of the state in which the threshold voltages of the nonvolatile memory cells are low, there is no need for providing a superfluous margin for the operation timing of the sense amplifier in the verify operation, and this allows the accuracy of the verify operation to be improved.

In one embodiment, the nonvolatile memory cells assume at least two states with respect to threshold voltage distribution thereof, and the threshold voltage of the reference cell is set at a lower limit of a threshold voltage distribution in a state in which the threshold voltages of the nonvolatile memory cells are high.

According to this embodiment, for example, a nonvolatile memory cell has a binary expression with the state 0 defined as a state in which the threshold voltage thereof is high and the state 1 defined as a state in which the threshold voltage is low, and the threshold voltage of the reference cell is set at the lower limit of the threshold voltage distribution of the state 0. It is to be noted that the operation for raising the threshold voltage of the nonvolatile memory cell from the state 1 to the state 0 is assumed to be the erase operation.

At this time, the nonvolatile memory cell put in the state 0 with the erase completed has been raised to the point of a threshold voltage higher than that of the reference cell. Therefore, in the case where the sense of the nonvolatile memory cell is terminated at the time when the sense of the reference cell is ended in the erase verify operation, it is determined that the nonvolatile memory cell is in the state 0 since the amount of current that can be flowed in the nonvolatile memory cell is less than in the reference cell and the electric charges precharged in the bit line are not sufficiently pulled. On the other hand, the nonvolatile memory cell in which the erase operation has not yet been terminated has a threshold voltage lower than that of the reference cell. Therefore, the amount of current that can be flowed in the nonvolatile memory cell is greater than in the reference cell, and the electric charges precharged in the bit line are sufficiently pulled. Therefore, it is determined that this memory cell is in the state 1, and erase is executed again.

As described above, by setting the threshold voltage of the reference cell at the lower limit of the threshold voltage distribution of the state 0 of the nonvolatile memory cells, there is no need for providing a superfluous margin for the timing of the sense operation in the verify operation, and this allows the accuracy of the verify operation to be improved.

In one embodiment, the reference cell is formed in a region that is electrically separated from the nonvolatile memory cells.

According to this embodiment, the reference cell is formed in the region that is electrically separated from the nonvolatile memory cells, and therefore, the reference cell receives no needless disturb. Therefore, the threshold voltage of the reference cell does not fluctuate, and the reliability is improved.

In one embodiment, a sense circuit is provided in correspondence with each of the bit lines of the nonvolatile memory cells and constructed so as to collectively read or verify the plurality of nonvolatile memory cells of which control gates are commonly connected to the same word line, and the reference cell is provided in correspondence with each of the word lines.

According to this embodiment, the read operation of the nonvolatile memory cell and the reference cell are executed by the same word line, and therefore, the memory cell and the reference cell are sensed by quite the same word line voltage. Therefore, the read accuracy can be improved.

In one embodiment, the reference cell is arranged farther apart from a decoder for controlling the word line than the nonvolatile memory cells.

According to this embodiment, the read operation that covers the margin due to the shift in rise time of the word line can be executed, and the read accuracy is improved.

A nonvolatile semiconductor storage device of one embodiment comprises a delay means for delaying a signal detected by the sense circuit connected to the reference cell before using the detected signal as a sense terminate signal of the nonvolatile memory cells that constitute the memory cell array.

According to this embodiment, the aforementioned delay time can be set to a time in which the variations in the characteristics of the reference cell and the nonvolatile memory cells in the memory cell array or the variations between the nonvolatile memory cells inside the memory cell array are absorbed. With this delay time setting, the read accuracy can be improved by absorbing the above-mentioned characteristic variations and removing the superfluous margin of the sense operation. Moreover, by optimizing the delay time, the improvement in read accuracy and the removal of the superfluous (excessive) read margin can be achieved, and the speed of read can be increased.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
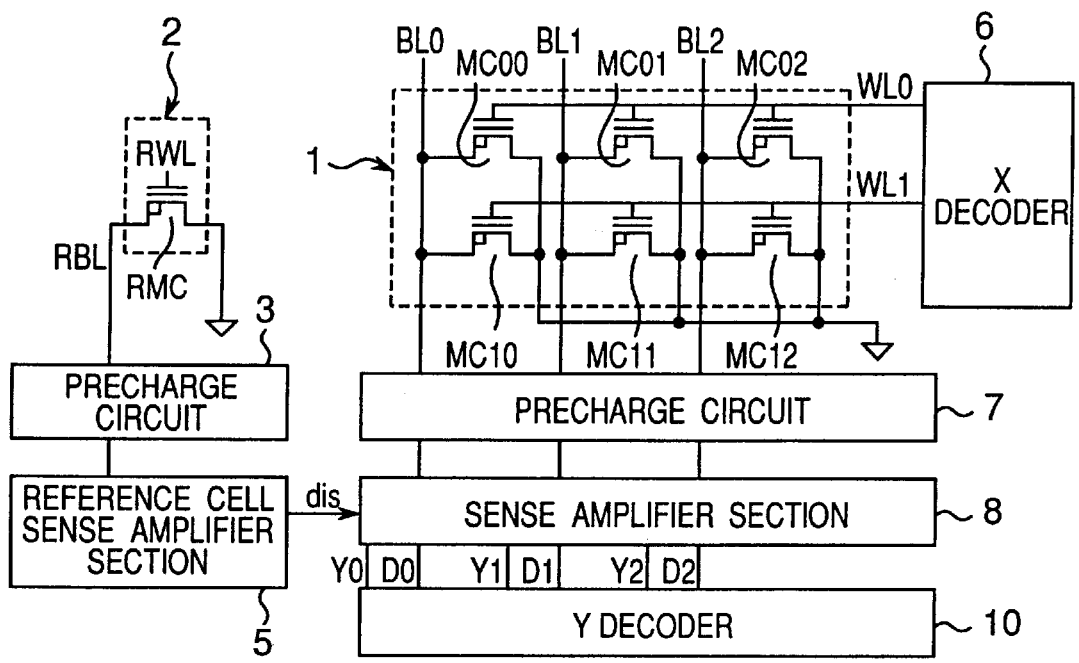
FIG. 1 is a block diagram of a nonvolatile semiconductor storage device according to a first embodiment of the present invention.

The nonvolatile semiconductor storage device of the present invention will be described in detail below on the basis of the embodiments thereof shown in the drawings.

[First Embodiment]

First of all, FIG. 1 shows a block diagram of a nonvolatile semiconductor storage device according to the first embodiment of the present invention. As shown in FIG. 1, this first embodiment comprises a memory cell array 1. This memory cell array 1 is constructed of a plurality of memory cells MC00 through MC12, . . . connected to word lines WL0, WL1, . . . and bit lines BL0, BL1, BL2, . . . . These memory cells MC00 through MC12, . . . are known flash memory cells (electric ally batch-erasable nonvolatile memory cells).

This memory cell array 1 is connected to a precharge circuit 7 by way of bit lines BL0, BL1, BL2, . . . .

The states of these memory cells MC00 through MC12, . . . are determined depending on the value of the threshold voltage Vt. In this case, a state in which the threshold voltage is high is defined as a state 0, while a state in which the threshold voltage is low is defined as a state 1. This embodiment has an X-decoder 6 for controlling the word lines WL0, WL1, . . . , a Y-decoder 10 for controlling bit lines BL0, BL1, and a sense amplifier section 8 for sensing the data to be stored in the memory cells MC00 through MC12, . . . .

This embodiment is provided with a reference cell (RMC) 2 constructed of a flash memory cell RMC, and a reference bit line RBL is connected to this reference cell 2. A precharge circuit 3 and a reference cell sense amplifier section 5 are connected to this reference bit line RBL.

The reference cell sense amplifier section 5 includes a sense operation control circuit, and this sense operation control circuit executes timing control of the sense operation of this nonvolatile semiconductor storage device. The reference cell 2 has the same structure as that of the flash memory cells MC00 through MC12, . . . which constitute the memory cell array 1.

The reference cell 2 for the read operation has its threshold voltage set to a threshold voltage Vref at the middle of a threshold voltage of the state 1 and a threshold voltage of the state 0. This setting is achieved by preliminarily alternately executing write operation with write pulses and verify operation in a reference cell 2.

Figure 2:
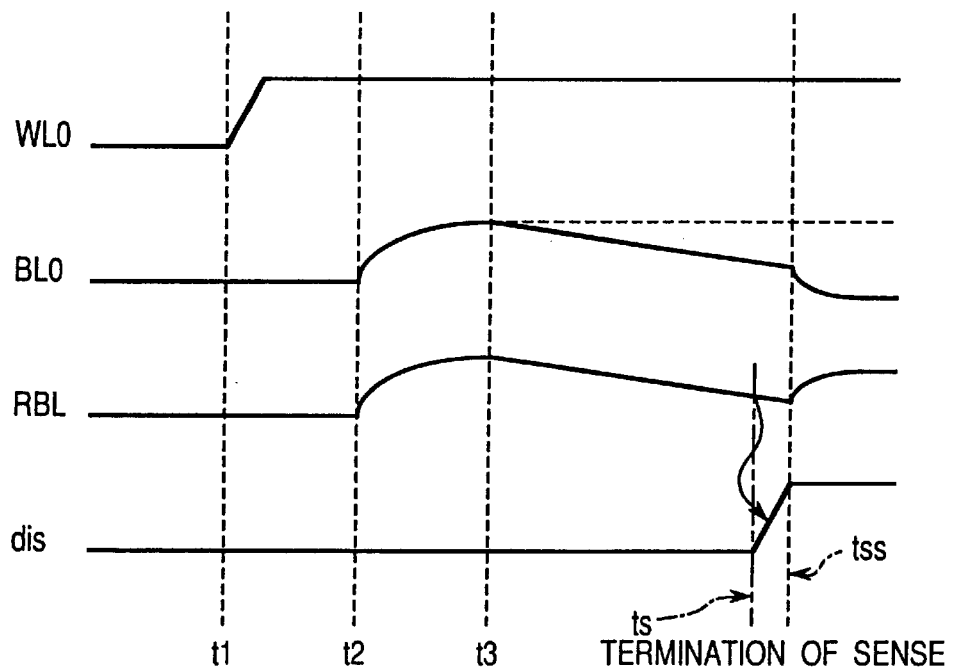
FIG. 2 is a timing chart of the read operation of the first embodiment.

Next, FIG. 2 shows the timing of the read operation in the nonvolatile semiconductor storage device of this embodiment. The read operation of this embodiment will be described on the basis of this timing chart. This read operation will be described in connection with the memory cell MC00 to be selected by the word line WL0 and the bit line BL0.

First of all, a read voltage is supplied to the word line WL0 of the selected cell MC00 at a time t1. Next, the bit line BL0 connected to the drain of the selected cell MC00 is precharged at a time t2. At the same time, the bit line RBL of the reference cell 2 is also precharged.

Then, after the termination of the precharge of the bit line BL0, the bit line BL0 and the sense amplifier section 8 are connected to each other at a time t3 to start the sense operation. At the same time, the sense operation of the reference cell 2 is also started.

Then, a current flows to the ground (ground voltage) via the reference cell 2, and therefore, the voltage of the sense node RBL of the reference cell 2 is lowered with a lapse of time. When the sense amplifier section 5 connected to the sense node RBL is inverted, a sense operation termination signal dis goes High to terminate the sense operation of the memory cell array 1.

In this case, the threshold voltage of the selected cell MC00 is higher than that of the reference cell 2 when the selected cell MC00 is in the state 0, and therefore, the voltage of the bit line BL0 has not yet been lowered at the point of time when the sense operation of the reference cell 2 is terminated as indicated by the dashed line in FIG. 2, and the sense amplifier section 8 is not inverted. When the selected cell MC00 is in the state 1, the threshold voltage of the selected cell MC00 is lower than that of the reference cell 2. Therefore, a current flows to the ground (ground voltage) via the memory cell MC00, and the voltage of the bit line BL0 is sufficiently lowered as indicated by the solid line in FIG. 2, and the sense amplifier section 8 is inverted.

As described above, the timing ts in which the sense of the reference cell 2 is completed is detected by the reference cell sense amplifier section 5, and a termination timing tss of the sense operation of the sense amplifier section 8 of the memory cell array 1 is controlled. By this operation, there is no need for generating control timing in accordance with an oscillator provided inside the chip or the like, and this obviates the need for providing a sense time margin taking variations in temperature, transistor characteristics and so on into consideration.

According to this embodiment, the operation timing of the sense amplifier that has absorbed the variations in the temperature characteristic in the memory cell characteristics can be generated. Since the reference cell 2 has the same structure as that of the memory cells MC00, MC01, . . . which constitute the memory cell array 1, and therefore, the temperature characteristic of the reference cell 2 coincides with that of the memory cells MC00, . . . .

Figure 3:
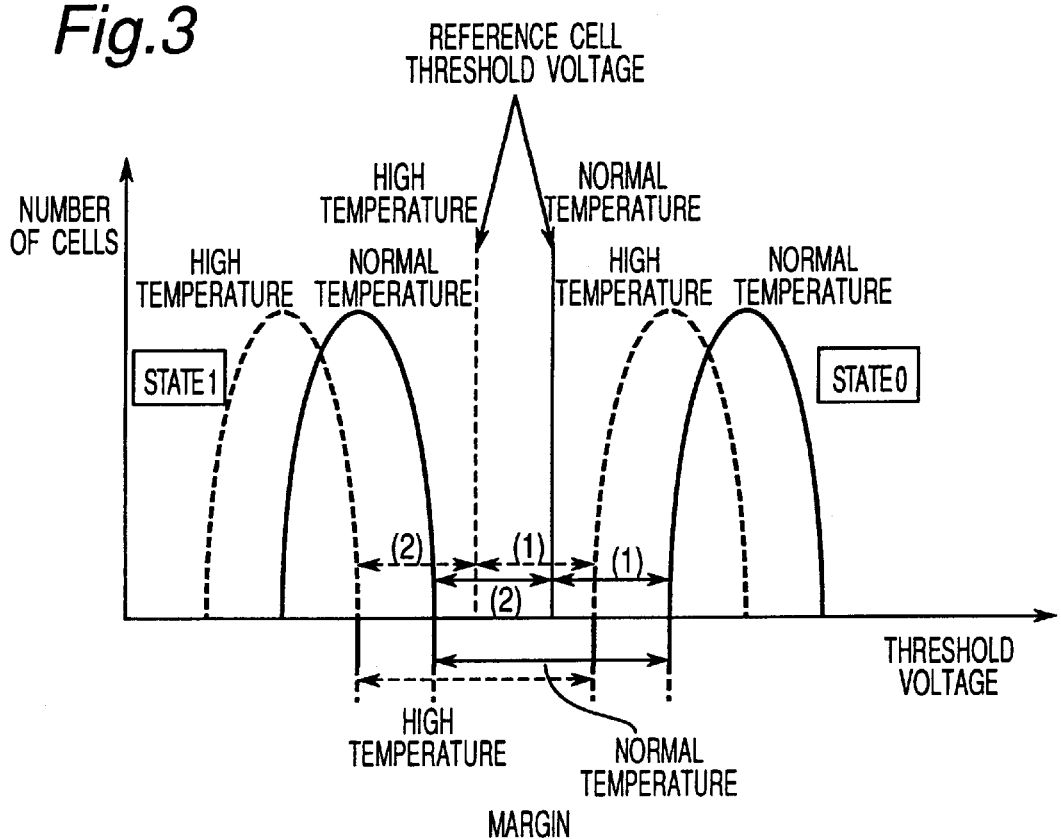
FIG. 3 is a graph of distribution showing a change in a threshold voltage Vt distribution depending on temperature.

Next, FIG. 3 shows how the threshold voltage values of the memory cells MC00, . . . in the memory cell array 1 are distributed depending on the state 1 and the state 0.

The memory cell in the state 0 (herein assumed to be the erase state) is in a state in which electrons are injected from a channel region into a floating gate via a tunnel oxide film. On the other hand, the memory cell in the state 1 (herein assumed to be the write state) is in a state in which electrons are extracted from the floating gate to the channel region via the tunnel oxide film.

As indicated by the broken line in FIG. 3, when the ambient temperature rises, the threshold voltage of the memory cell is shifted to the lower side.

At this time, the reference cell 2 has the same structure and same characteristics as those of the memory cells MC00, M01, . . . , and therefore, the threshold voltage value of the reference cell 2 is shifted similarly to the memory cells MC00, M01, . . . . Therefore, relations among the lower limit of the threshold voltage distribution of the memory cells MC00, . . . in the state 0, the upper limit of the threshold voltage distribution in the state 1 and the threshold voltage value of the reference cell 2 do not basically change even when the ambient temperature changes.

Therefore, a difference (margin (1)) between the lower limit of the threshold voltage distribution of the memory cells MC00, . . . in the state 0 and the threshold voltage value of the reference cell 2 is kept constant even when the ambient temperature changes. Also, a difference (margin (2)) between the threshold voltage value of the reference cell 2 and the upper limit value of the threshold voltage distribution of the memory cells MC00, . . . in the state 1 is kept constant even when the ambient temperature changes.

As shown in FIG. 3, even if the threshold voltage Vt distribution of the memory cells MC00, . . . is shifted by a change in temperature, the threshold voltage Vt of the reference cell 2 is similarly shifted. Therefore, the sense timing follows the cell characteristics, and the relative read level does not change. This obviates the need for taking the variation in the sense timing into consideration and allows high-accuracy read operation to be achieved.

Next, the verify operation in the embodiment shown in FIG. 1 will be described with reference to FIG. 4. This verify operation is basically similar to the read operation, and sense is executed in accordance with similar timing. The threshold voltage of the reference cell, which becomes a reference for the sense time, differs from that of the read operation.

Figure 4:
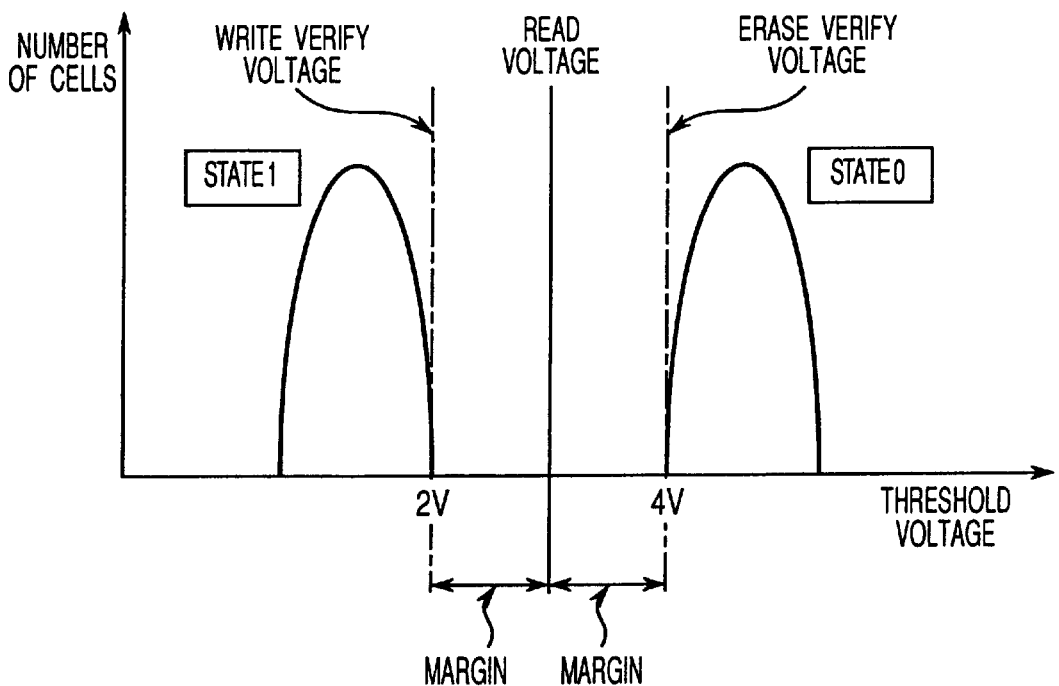
FIG. 4 is a graph of distribution showing Vt distribution in the write state and erase state of a memory cell.

In the threshold voltage Vt distribution of the memory cell shown in FIG. 4, the operation to extract electrons from the memory cell to change the cell state from the state 0 to the state 1 is defined as the write operation, and conversely, the operation to inject electrons into the memory cell to change the cell state from the state 1 to the state 0 is defined as the erase operation.

For example, in order to secure a voltage of 1 V as a read margin with respect to each of the state 0 and the state 1 V with a read voltage of 3 V, it is required to set the lower limit of the threshold voltage distribution of the memory cells in the state 0 to 4 V and to set the upper limit of the threshold voltage distribution of the memory cells in the state 1 to 2 V. Therefore, it is required to execute verify after the application of an erase pulse and verify after the application of a write pulse so as to achieve adjustment to the foregoing specified threshold voltage while examining the threshold voltage value.

In the write verify operation, it is required to determine whether or not the memory cell has been put in the state 1 or whether the threshold voltage Vt has become 2 V or less. Therefore, a write verify voltage is set to 2 V. That is, the threshold voltage Vt of the reference cell 2 for write verify use is set to 2 V.

In the erase operation, it is required to determine whether or not the memory cell has been put in the state 0 or whether the threshold voltage Vt has become 4 V or more. Therefore, an erase verify voltage is set to 4 V. That is, the threshold voltage Vt of the reference cell 2 for erase verify use is set to 4 V.

It is acceptable to employ the same cell as the foregoing reference cell for read use as the reference cell 2 for write verify use and the reference cell 2 for erase verify use and preliminarily set the cells to a specified threshold voltage by write or erase operation and verify before the start of the write operation and the erase operation. Otherwise, it is acceptable to provide separate reference cells and set the cells to the respective specified threshold voltages.

Figure 5:
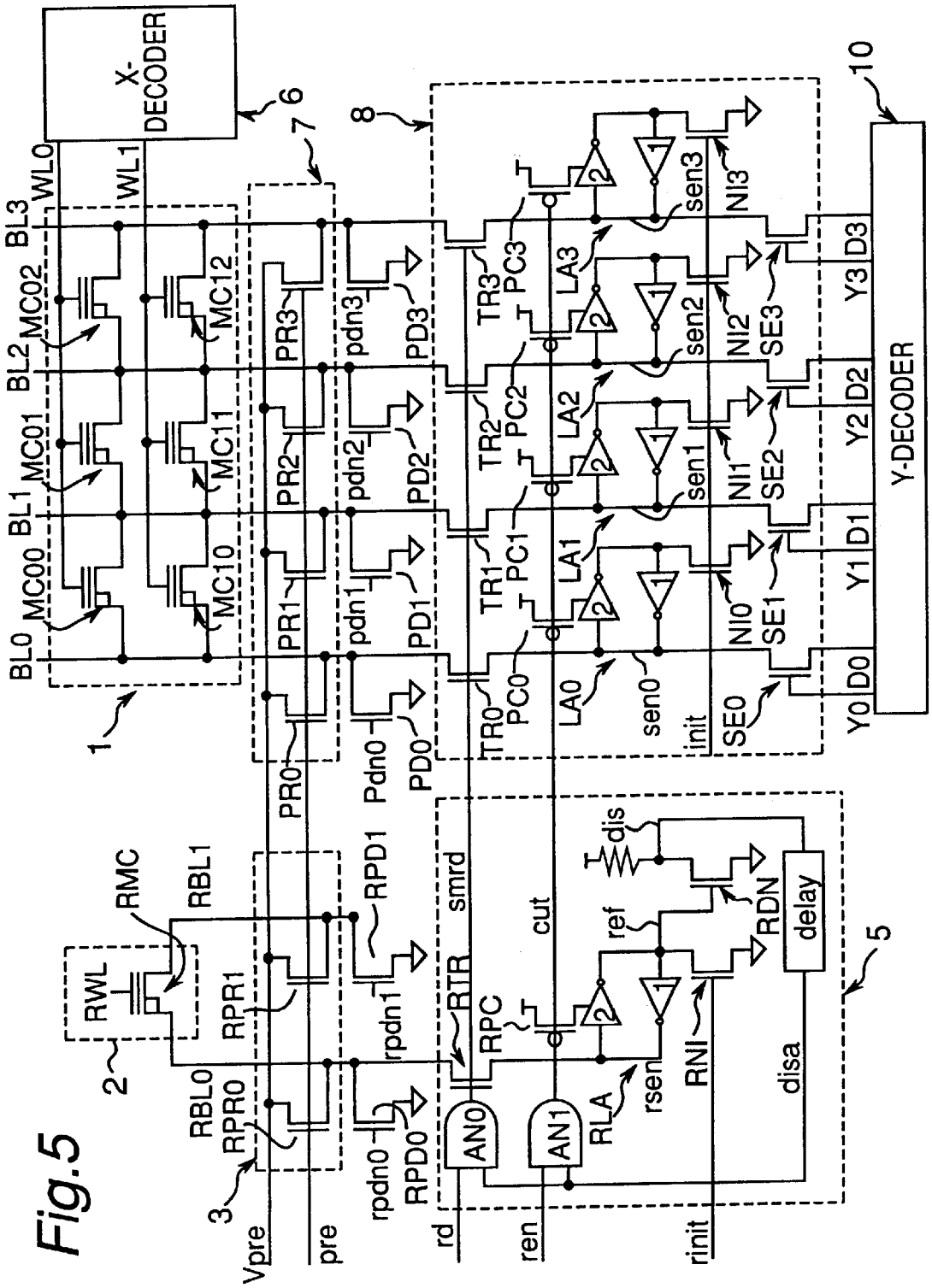
FIG. 5 is a circuit diagram of a nonvolatile semiconductor storage device of the above embodiment.

Next, FIG. 5 shows a more detailed circuit construction of the nonvolatile semiconductor storage device of this embodiment. In FIG. 5 are shown a virtual ground type memory cell array 1. Memory cells MC00, MC01, . . . are constructed of ACT (Asymmetrical Contactless Transistor) cells of an ACT type flash memory.

In this ACT type flash memory, the drain of a memory cell and the source of another memory cell adjacent to the memory cell share a bit line. The ACT type flash memory is suitable for the virtual ground type memory cell array structure. Moreover, by virtue of the formation of the shared line of a diffusion layer, high-density mounting can be achieved, which is suitable for a large-capacity flash memory. This ACT type flash memory is described in detail in Japanese Patent Laid-Open Publication No. HEI 9-92739 by the present applicant and others.

The present invention will be described more in detail below on the basis of an embodiment that employs an ACT type memory cell.

The ACT cell operates as follows. It is to be noted that the FN (Fowler-Nordheim) tunnel effect is utilized for write and erase. Reference is first made to the read and verify operations. The read and verify operations are executed through an identical operation.

Figure 6A:
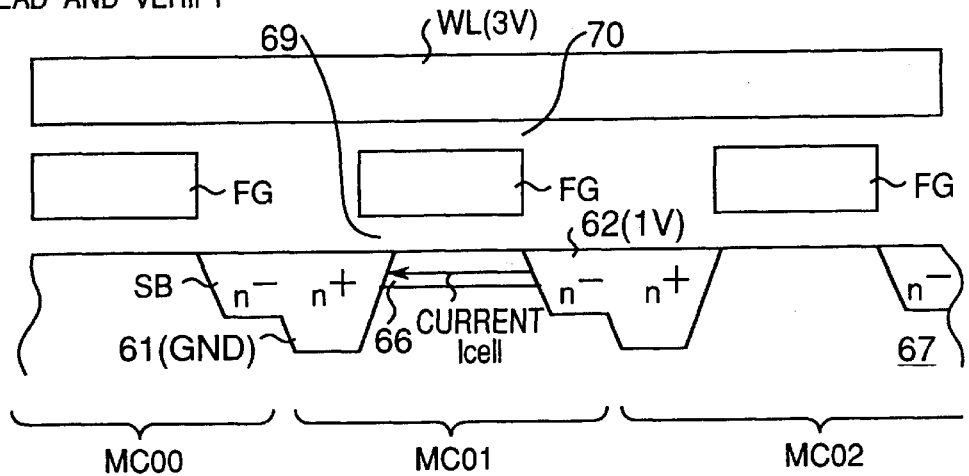
FIGS. 6A, 6B and 6C are explanatory views of an ACT cell.
Figure 6B:
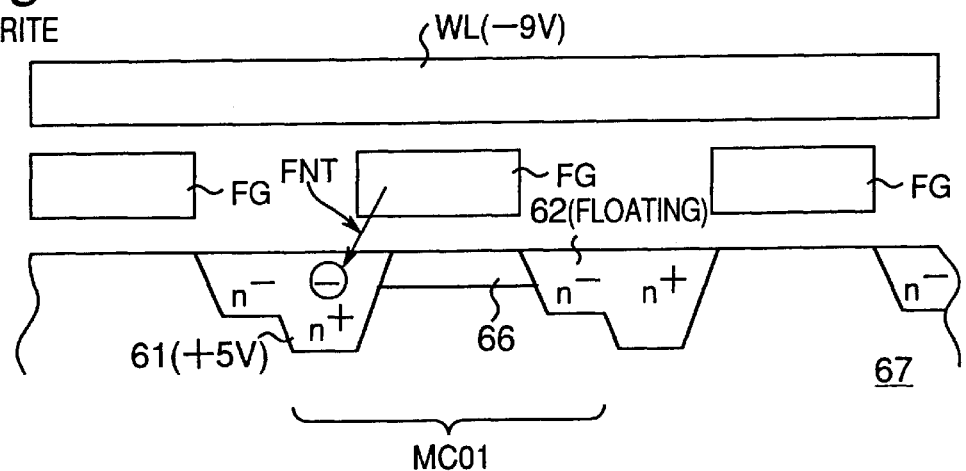
Figure 6C:
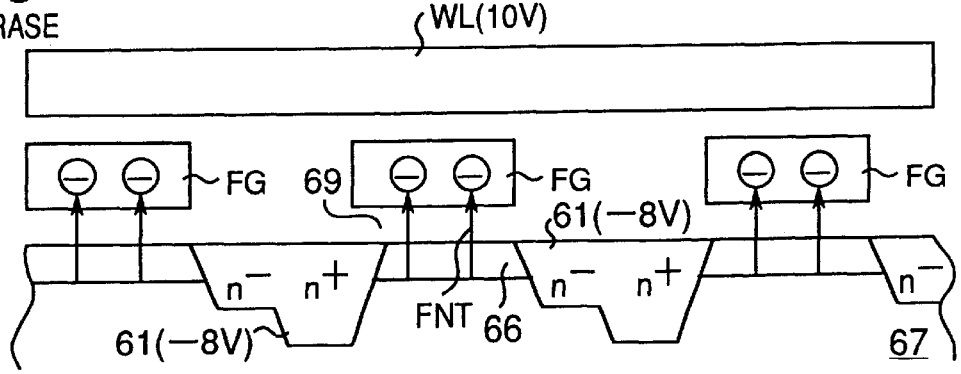

FIGS. 6A through 6C schematically show the section of the ACT type memory cell MC01.

This memory cell MC01 includes a source (n⁻) 62 and a drain (n⁺) 61 formed on a substrate (or p-well) 67 and a channel region 66 interposed between the source 62 and the drain 61 and includes a floating gate FG above the regions via a tunnel oxide film 69. In addition, a control gate is formed on this floating gate FG via a layer insulation film 70. In FIGS. 6A through 6C, this control gate is illustrated as a word line WL connected to the control gate.

The drain 61 of the memory cell MC01 and the source of the adjoining memory cell MC00 are shared, and a sub-bit line SB is formed of a diffusion layer n⁻. This sub-bit line SB is connected to a main bit line of a different layer via a contact portion (not shown). In FIG. 5, this sub-bit line SB and the main bit line are illustrated not apart but merely as BL0, BL1, . . . .

The memory cell during read and verify will be described with reference to FIG. 6A.

First of all, it is assumed that the memory cell MC01 is subjected to read. A voltage of 3 V is applied to the word line WL connected to the control gate of the memory cell MC01. Then, a sub-bit line located on the drain 61 side of the memory cell MC01 is made to have a reference voltage (0 V, for example), and a precharge voltage of 1 V is applied to the sub-bit line located on the source 62 side. The substrate (or p-well) 67 is made to have a reference voltage (0 V, for example).

With this arrangement, since the threshold voltage is not lower than 4 V when the memory cell MC01 is in the state 0, no cell current flows, and the precharge voltage of 1 V is maintained. Since the threshold voltage is not higher than 2 V when the memory cell MC01 is in the state 1, a cell current Icell flows as shown in FIG. 6A, and the precharge voltage of 1 V is accordingly lowered.

By sensing this precharge voltage by the sense amplifier section 8, it is determined whether the memory cell MC01 is in the state 0 or the state 1. The above has described the read operation.

The verify operation differs from that of the aforementioned read operation only in that a voltage of 2 V is applied to the word line WL in the verify operation during write and a voltage of 4 V is applied to the word line WL in the verify operation during erase.

Next, write pulse applying operation during write into the memory cell MC01 will be described with reference to FIG. 6B. In this operation, the selected memory cell MC01 is subjected to write.

A negative high voltage (−9 V, for example) is applied to the word line WL connected to the control gate of the memory cell MC01. A positive voltage (5 V, for example) is applied to the sub-bit line located on the drain 61 side, and the sub-bit line located on the source 62 side is put into a floating state (high impedance state). Then, the drain side sub-bit line of other nonselected memory cells is set to 0 V. The substrate (or p-well) 67 is set to a reference voltage (0 V, for example) A voltage of 0 V is applied to the word line connected to the control gate of the non-selected memory cells.

By the above operation, FN tunneling phenomenon FNT is generated between the drain (n⁺) 61 side and the floating gates FG of the memory cell MC01 subjected to write, and electrons are extracted to the drain 61 (n⁺) side from the floating gate FG via a tunnel oxide film 69. As a result, the threshold voltage of the memory cell MC01 is lowered and put into the state 1 (write state in this case).

Furthermore, in order to make the threshold voltage of the memory cell MC01 have a specified threshold voltage (not higher than 2 V ), this write voltage (−9V) is applied in a pulse form to the word line WL. Subsequently, the threshold voltage of the memory cell MC01 is verified by the verify operation. When the threshold voltage does not reach the specified threshold voltage (not higher than 2 V ), the write voltage pulse is applied again to the word line WL. As described above, the write voltage application and verify are repeated until the memory cell MC01 reaches the specified threshold voltage. The above has described the write operation.

Finally, erase pulse applying operation during erase of the memory cell MC01 will be described with reference to FIG. 6C. This erase is executed in batches of blocks or on all the memory cells.

A positive high voltage (10 V, for example) is applied to the word line WL connected to the control gate of the memory cell MC01 to be subjected to erase. A negative voltage (−8 V, for example) is applied to the sub-bit lines located on the drain 61 side and the source 62 side and the substrate (or p-well) 67. By this operation, the FN tunneling phenomenon FNT is generated between the channel region 66 of the substrate (or p-well) 67 and the floating gate FG, and electrons are injected from the channel region 66 into the floating gate FG via the tunnel oxide film 69. As a result, the threshold voltage of the memory cell MC01 is raised and put into the state 0 (erase state in this case).

Further, in order to make the memory cell MC01 have a specified threshold voltage (not lower than 4 V ), the positive high voltage (erase voltage) is applied in a pulse form to the word line WL, and thereafter, the threshold voltage is verified by the verify operation. When the threshold voltage does not reach the specified threshold voltage, the erase voltage pulse is applied again. As described above, the erase voltage application and verify are repeated until the memory cell MC01 reaches the specified threshold voltage. The above has described the erase operation.

The present embodiment will be continuously described further with reference to FIG. 5.

In FIG. 5, the word lines WL0 and WL1 and the bit lines BL0 through BL3 of the memory cell array 1 are shown, and only the portion necessary for the description of the present invention is shown.

In FIG. 5, the sense amplifier section 8 has sense circuits LA0, LA1, LA2 and LA3 provided for the bit lines BL0, BL1, BL2 and BL3. The sense circuits LA0 through LA3 respectively include two inverters 1 and 2, and operate also as a data latch circuit. Also, the precharge circuit 7 has bit line precharge transistors PR0 through PR3. Also, there are provided bit line pull-down transistors PD0 through PD3.

The sense circuits LA0 through LA3 are latch type sense circuits for detecting whether or not the precharge voltage is lowered and detects whether or not the voltages of the sense nodes sen0 through sen3 are lowered. The sense amplifier section 8 has transistors TR0 through TR3 for connecting the bit lines to the sense amplifier. In addition, the sense amplifier section 8 has transistor SE0 through SE3 for selecting the sense nodes sen0 through sen3, transistors NI0 through NI3 for initializing the sense circuits LA0 through LA3 and sense circuit enable transistors PC0 through PC3.

This embodiment has a reference cell (RMC) 2 and a reference cell sense amplifier section 5. The reference cell 2 is an ACT cell similar to the cells that constitutes the memory cell array 1, and the operation is similar to that of the aforementioned ACT cell.

In this reference cell 2, the threshold voltage of the reference cell for read is set to a value (3 V in this case) between the upper limit value of the threshold voltage distribution of the program cell and the lower limit value of the threshold voltage distribution of the erase cell. The threshold voltage is set to 2 V in the reference cell 2 for write verify use, while the threshold voltage is set to 4 V in the reference cell 2 for erase verify use.

The reference sense amplifier section 5 includes a sense circuit RLA and a logic circuit that generates a signal for controlling a smrd signal and a cut signal from the sense result similarly to that of the main sense amplifier section 8. The sense circuit RLA is constructed of two inverters 1 and 2. This logic circuit is constructed of transistors RDN and RTR, a delay circuit (delay), an AND circuit AN0 and an AND circuit AN1. Moreover, a precharge circuit 3 is connected between this sense amplifier section 5 and the reference cell 2. This precharge circuit 3 has precharge transistors RPR0 and RPR1. Further, there are provided pull-down transistors RPD0 and RPD1. The AND circuits AN0 and AN1, transistors RTR and RPC, and nodes smrd and cut constitute an example of a timing control means for controlling the termination timing of the sense operation of the sense amplifier section 8.

Next, the read operation of the nonvolatile semiconductor storage device of the above embodiment will be described herein with reference to the timing chart shown in FIG. 7. The operation when the cell MC00 is sensed as a cell to be read is described. The present embodiment has a virtual ground type memory array structure. Therefore, when the memory cell MC00 is sensed, the bit line BL0 operates as a selected bit (drain side), and the bit line BL1 operates as a source line.

The condition of the voltage applied to the memory cell MC00 for read is similar to that described in connection with the MC01 used as an example in the previously described FIG. 6A, and the main operation will be described below. First of all, the threshold voltage of the reference cell (RMC) 2 is set to 3 V in advance. This threshold value (3V) is set approximately at the middle of the lower limit (4 V) of the threshold voltage distribution in the state 0 and the upper limit (2 V) of the threshold voltage distribution in the state 1 of the memory cell MC00 as shown in FIG. 4. By this operation, the read margin can be widened most with respect to the aforementioned lower limit (4 V) and the upper limit (2 V). Therefore, even if the threshold voltage distribution is spread by the received influence (disturb) of the state of the adjoining memory cell due to the fact that adjoining memory cells are sharing the bit line in the virtual ground type memory cell array structure, a margin for the threshold voltage distribution can be secured. This fact becomes effective particularly in a construction in which the reference cell as described later is provided for each bit line.

Although the state 1 is defined as the erase state and the state 0 is defined as the write state according to the above description, this is a matter of mere initial setting, and the reverse is also acceptable.

Figure 7:
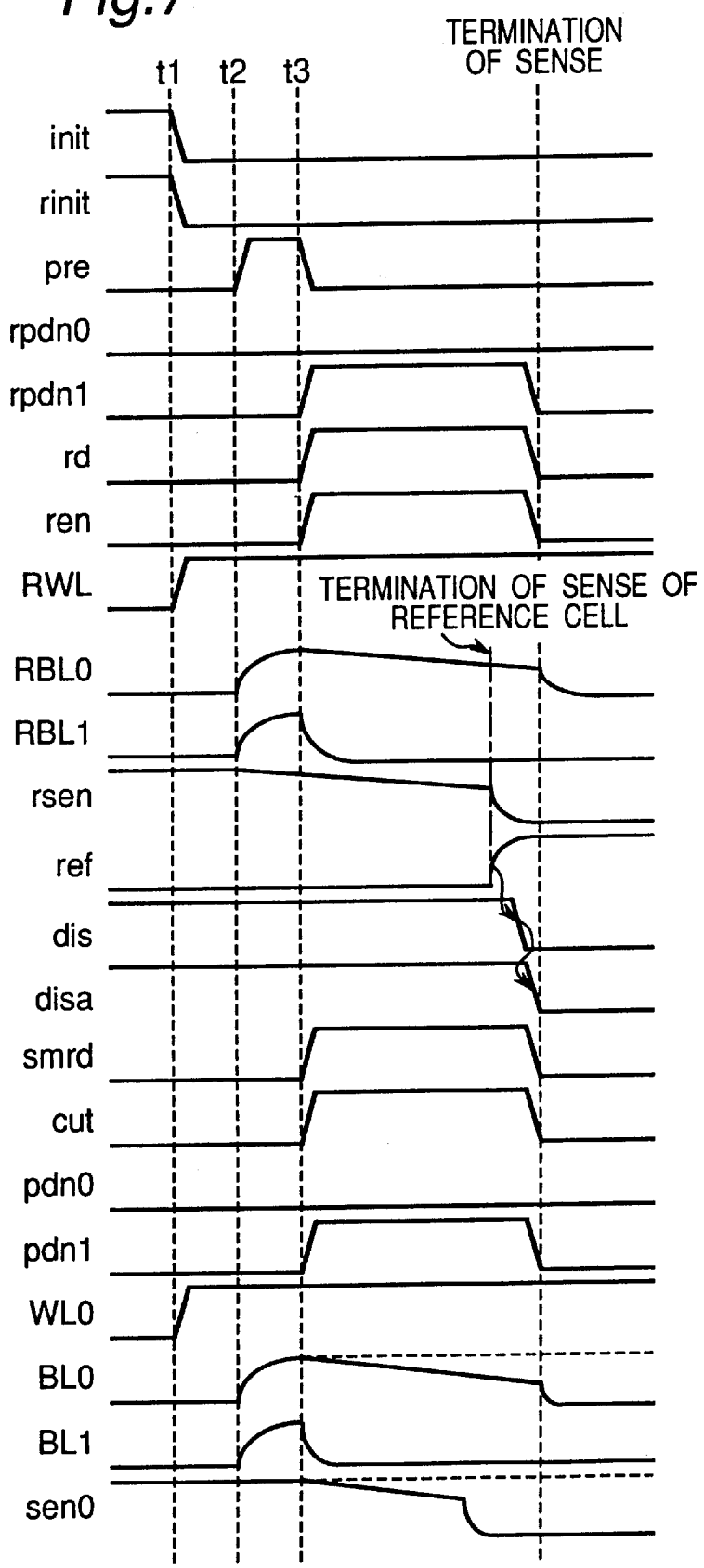
FIG. 7 is a timing chart of the read operation of the nonvolatile semiconductor storage device of the above embodiment.

In the initial state before the time t1 shown in FIG. 7, both initialization signals init and rinit have High level. Therefore, the transistors NI0 through NI3 for initialization in the sense amplifier section 8 and the transistor RNI of the sense amplifier section 5 are in the ON state.

The sense circuits i.e. sense amplifiers LA0 through LA3 are connected to the bit lines BL0 through BL3 of the main memory array 1 via the transistors TR0 through TR3 for connection use. The sense circuit i.e. sense amplifier RLA is connected to the bit line of the reference cell 2 via the transistor RTR for connection use.

On the other hand, a control signal ren has Low level in the initial state. Therefore, a node cut comes to have Low level, and the enable transistors PC0 through PC3 that are p-MOS transistors in the sense circuits LA0 through LA3 and an enable transistor RPC of the sense circuit RLA are put in the ON state. Therefore, the output stage of an inverter 2 that constitutes part of the latch circuit of the sense amplifier sections 5 and 8 is in a high impedance state. Therefore, the nodes sen0 through sen3 and rsen are fixed to High level in the initialized state.

It is to be noted that the node smrd comes to have Low level since the control signal rd has Low level at this point of time, and therefore the transistors (RTR and TR0 through TR3) for connection use are in the OFF state, with the result that the bit lines RBL0 and BL0 through BL3 are electrically separated from the sense amplifiers RLA and LA0 through LA3.

Next, when the sense for read is started at the time t1 to t2 of FIG. 7, a read voltage (3 V, for example) is first applied to the word line WL0 connected to the control gate of the selected cell MC00 to be subjected to read and the word line RWL connected to the control gate of the reference cell 2. It is to be noted that a voltage of 0 V is applied to the non-selected word line (WL1 in FIG. 5).

The initialization signals init and rinit of the sense amplifier are made to have Low level, and the transistors NI0 through NI3 and RNI for initialization use are put in the OFF state. By this operation, with regard to the latch circuits LA0 through LA3 and RLA of the sense amplifier sections 8 and 5, the output nodes sen0 through sen3 and rsen are shifted from a fixed state to an enable state while maintaining High level.

A transistor RDN for shaping the waveform of a signal ref of the node ref and inverting the level is provided on the reference cell side, and therefore, a signal dis and a signal disa obtained by delaying this signal dis through a delay circuit delay are both maintaining High level.

Next, the precharge of the bit line is executed at the stage of time t2 to t3.

The precharge control signal pre comes to have High level, and the bit line precharge transistors PR0 through PR3, RPR0 and RPR1 are turned on. Consequently, all the bit lines BL0, BL1, . . . of the memory cell array 1 and the bit lines RBL0 and RBL1 for the reference cell (RMC) 2 are precharged with a precharge voltage Vpre (about 1.5 V).

When the precharge of all the bit lines of the memory cell array 1 and the bit lines of the reference cell is terminated, the precharge control signal pre is first set back to Low level at the stage of time t3 to the termination of sense. By this operation, the transistors PR0 through PR3, RPR0 and RPR1 for bit line precharge use are set back to the OFF state, and the precharge potential is maintained.

Subsequently, the transistors TR0 through TR3 and RTR for connection use are turned on by making the control signal rd have High level and making the node smrd have High level. By this operation, the nodes sen0 through sen3 of the sense amplifier section 8 are connected to the bit lines of the memory cell array 1, and the node rsen of the sense amplifier section 5 is connected to the bit line of the reference cell 2.

Further, by making the control signal ren have High level, the node cut is made to have High level and the p-MOS transistors PC0 through PC3 and RPC for sense circuit enable use are turned off. By this operation, the output stage of the inverter 2 constituting part of the latch circuits LA0 through LA3 and RLA of the sense amplifier sections 8 and 5 becomes a normal output stage from the high impedance state. Consequently, the latch circuits LA0 through LA3 and RLA are made operable or able to sense depending on the voltage conditions of the nodes sen0 through sen3 and rsen.

At this point of time, the aforementioned nodes sen0 through sen3 and rsen are still maintaining the initialized state of High level.

Further, in order to set to 0 V the bit lines BL1 and RBL1 corresponding to the source side of the memory cell MC00 to be subjected to read and the reference cell RMC among the bit line pull-down transistors PD0 through PD3, RPD0 and RPD1, which have been put in the OFF state, control signals pdn1 and rpdn1 are made to have High level to turn on the bit line pull-down transistors PD1 and RPD1.

By this operation, the precharge voltage of the bit lines BL1 and RBL1 is lowered and fixed to 0 V. By this operation, the memory cell M00 and the reference cell (RMC) 2 start to be sensed.

Since the cell current flows on the reference cell 2 side, the voltage precharged in the bit line RBL0 reduces as time elapses. When the voltage level of the node rsen that is making a transition similarly to the bit line BL1 becomes lower than the threshold voltage of the input stage of the inverter 2 that constitutes part of the latch circuit RLA inside the sense amplifier section 5 for reference cell use, the latch circuit RLA is inverted (one-dot chain line portion of the bit line RBL0 of FIG. 7).

By this operation, the node ref is inverted to High level, and this High-level signal is inverted by the waveform shaping transistor RDN, and therefore, the signal dis changes from High level to Low level. Then, this signal dis becomes a delayed signal disa through the delay circuit delay. As a result, the signal disa is delayed for a specified time with respect to the signal dis and changed from High level to Low level. Due to the change of the signal disa to Low level, the nodes smrd and cut are changed to Low level regardless of the signal levels of the control signals rd and ren.

The delay circuit (delay), the AND circuits AN0 and AN1 and the nodes smrd and cut constitute a timing control means.

With this arrangement, the transistors TR0 through TR3 and RTR for connection use are changed into the OFF state, and therefore, the bit lines BL0 through BL3 and RBL0 are electrically disconnected from the sense amplifier sections 8 and 5 on both sides of the memory cell array 1 and the reference cell 2.

The enable transistors PC0 through PC3 and RPC are concurrently changed into the ON state, and the output stage of the inverter 2 constituting part of the latch circuits RLA and LA0 through LA3 of the sense amplifier sections 5 and 8 is put into the high impedance state. Therefore, the state of the memory cell MC00 to be subjected to read is latched and fixed in the latch circuit LA0.

At this point of time, when the selected memory cell MC00 to be subjected to read is in the state 1 (write in state), the threshold voltage of the memory cell MC00 is not higher than 2 V. Consequently, a cell current flows via the memory cell MC00. Therefore, since the voltage precharged in the bit line BL0 has been sufficiently lowered to 0 V (discharged), the latch circuit LA0 is surely inverted, and the node sen0 has Low level.

When the selected memory cell MC00 to be subjected to read is in the state 0 (erase state), the threshold voltage of the memory cell MC00 is not lower than 4 V. Consequently, no cell current flows via the memory cell MC00, and the voltage precharged in the bit line BL0 is maintained. Therefore, the latch circuit LA0 is not inverted, and the node sen0 maintains High level.

Then, the control signals rpdn0, rpdn1, rd, ren and pdn1 are set back to Low level to terminate the read of the memory cell MC00.

Although not shown, read of other memory cells are successively executed by the same method, and the memory cells MC01 and MC02 whose control gates are connected to an identical word line WL0 are subjected to read. Thereafter, control signals Y0 through Y3 from the Y-decoder 10 are made to have High level. By this operation, the previously latched data are outputted from the nodes D0 through D3 via transistors SE0 through SE3. The above has described the read operation.

Next, in the verify operation, it is proper to preparatorily set the threshold voltage of the reference cell (RMC) 2 to 2 V for the write verify operation. For the erase verify operation, it is proper to preparatorily set the threshold voltage of the reference cell 2 to 4 V. Those operations are basically the same as the operations described above, and therefore, no description is provided therefor.

The circuit of the embodiment shown in FIG. 5 has one reference cell (RMC) 2. Therefore, the reference cell 2 is to be preparatorily set to a specified threshold voltage corresponding to each operation before starting each of the operations of the write operation, the erase operation and the read operation. This threshold voltage setting is executed by repetitively applying a write pulse or an erase pulse and executing verify for the reference cell 2.

According to this system, the reference cell 2 is required to be preparatorily reset to the specified threshold voltage before starting the write operation, the erase operation and the read operation, and therefore, the processing speed becomes slow.

Second Embodiment

Figure 8:
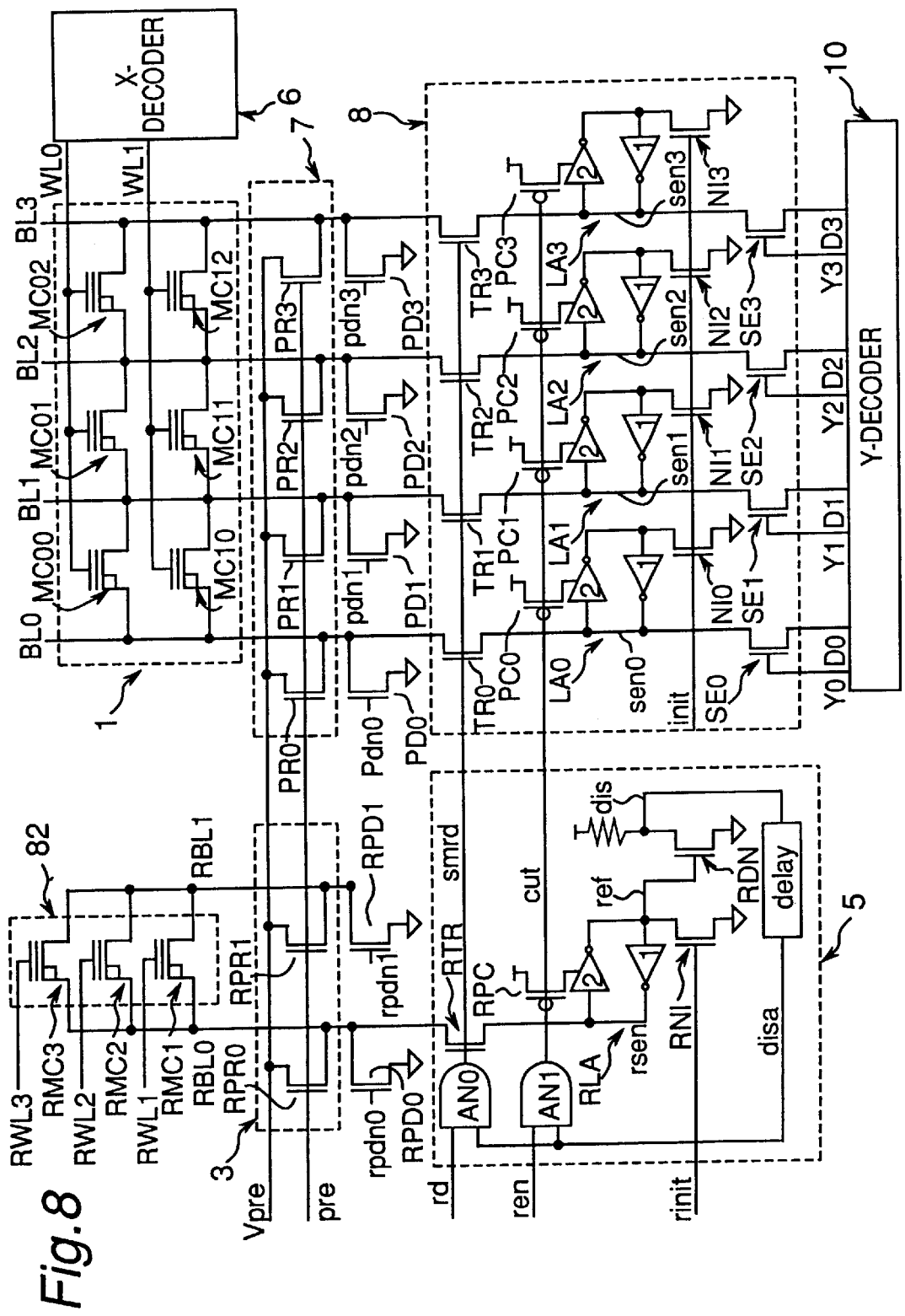
FIG. 8 is a circuit diagram according to a second embodiment of the present invention.

FIG. 8 shows the second embodiment, which is improved with regard to the aforementioned points. This second embodiment differs from the first embodiment shown in FIG. 5 only in the following point.

(1) A reference cell section 82 is provided in place of the reference cell 2. This reference cell section 82 has a reference cell RMC1 for read use, a reference cell RMC2 for write verify use and a reference cell RMC3 for erase verify use. The reference cells RMC1, RMC2 and RMC3 are preparatorily set to the respective specified threshold voltages for read use, write verify use and erase verify use.

According to this second embodiment, during read, the word line RWL1 is set to 3V so as to drive the reference cell RMC1 for read use. On the other hand, other word lines RWL2 and RWL3 are set to 0 V so as not to drive the reference cell RMC2 for write verify use and the reference cell RMC3 for erase verify use.

In the verify operation during write, the word line RWL2 is set to 2 V so as to drive the reference cell RMC2 for write verify use. On the other hand, other word lines RWL1 and RWL3 are set to 0 V so as not to drive the reference cell RMC1 for read use and the reference cell RMC3 for erase verify use.

In the verify operation during erase, the word line RWL3 is set to 4 V so as to drive the reference cell RMC3 for erase verify use. On the other hand, other word lines RWL1 and RWL2 are set to 0 V so as not to drive the reference cell RMC2 for write verify use and the reference cell RMC1 for read use.

The operations and voltage applying conditions of other circuit blocks are the same as those of the embodiment of FIG. 5.

As described above, according to this second embodiment, there is no need for preparatorily resetting the reference cells RMC1, RMC2 and RMC3 to the specified threshold voltage before starting the write operation, the erase operation and the read operation, and therefore, the processing speed becomes fast.

Third Embodiment

Figure 9:
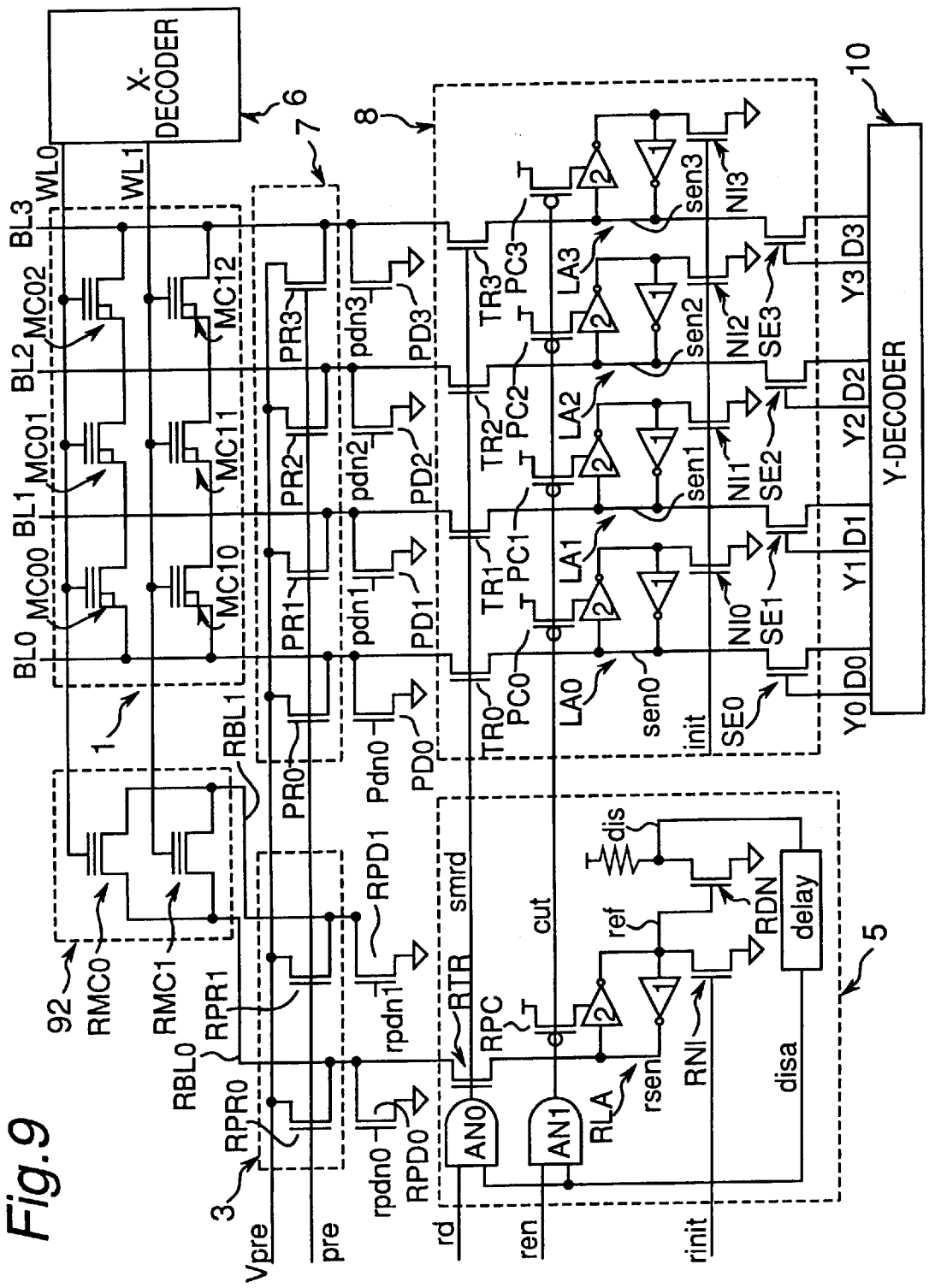
FIG. 9 is a circuit diagram according to a third embodiment of the present invention.

Next, FIG. 9 shows the third embodiment.

This third embodiment differs from the first embodiment of FIG. 5 in that a reference cell section 92 is provided in place of the reference cell 2.

This reference cell section 92 is constructed of reference cells RMC0 and RMC1. The control gate of this reference cell RMC0 is connected to a word line WL0, while the control gate of the reference cell RMC1 is connected to the word line WL1. As described above, in the present third embodiment, the reference cells RMC0 and RMC1 are connected to the word lines WL0 and WL1 of the memory cell array 1.

In this third embodiment, the voltages applied from the X-decoder circuit 6 to the word lines WL0 and WL1 are applied to the reference cells RMC0 and RMC1 and the selected memory cells MC00 through MC02 and MC10 through MC12. That is, an identical voltage is applied to the selected memory cell to be subjected to read and the reference cell. This removes the variations in the cell current due to the variations in the voltage applied to the word line, further increasing the read accuracy.

Fourth Embodiment

Figure 10:
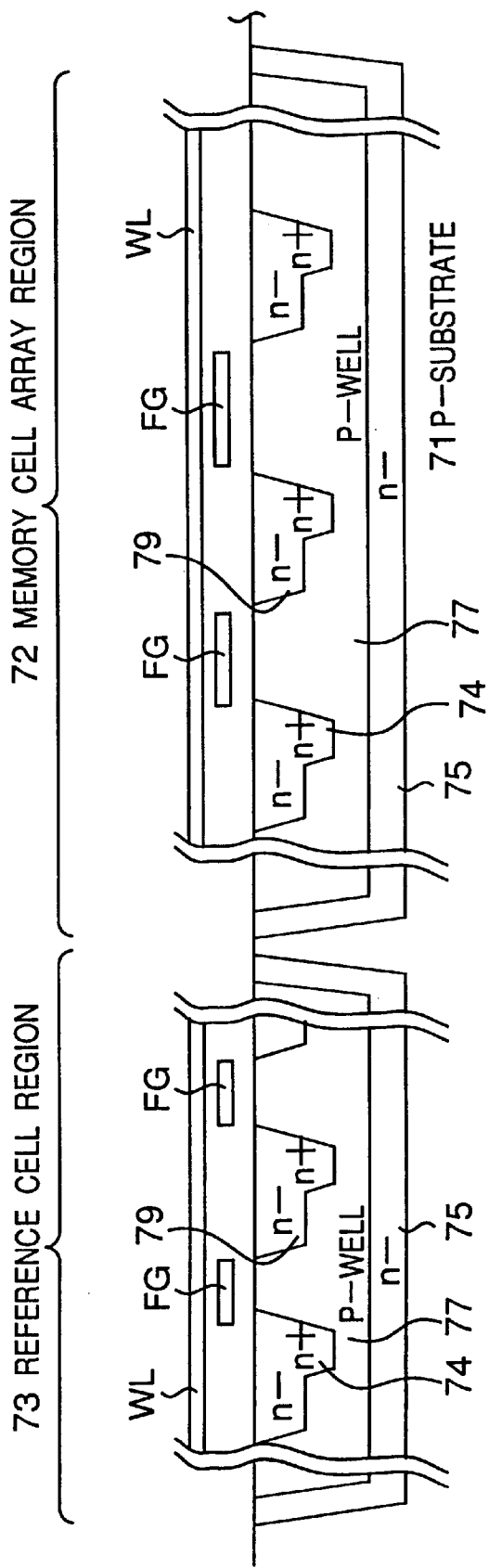
FIG. 10 is a sectional view according to a fourth embodiment of the present invention.
Figure 11:
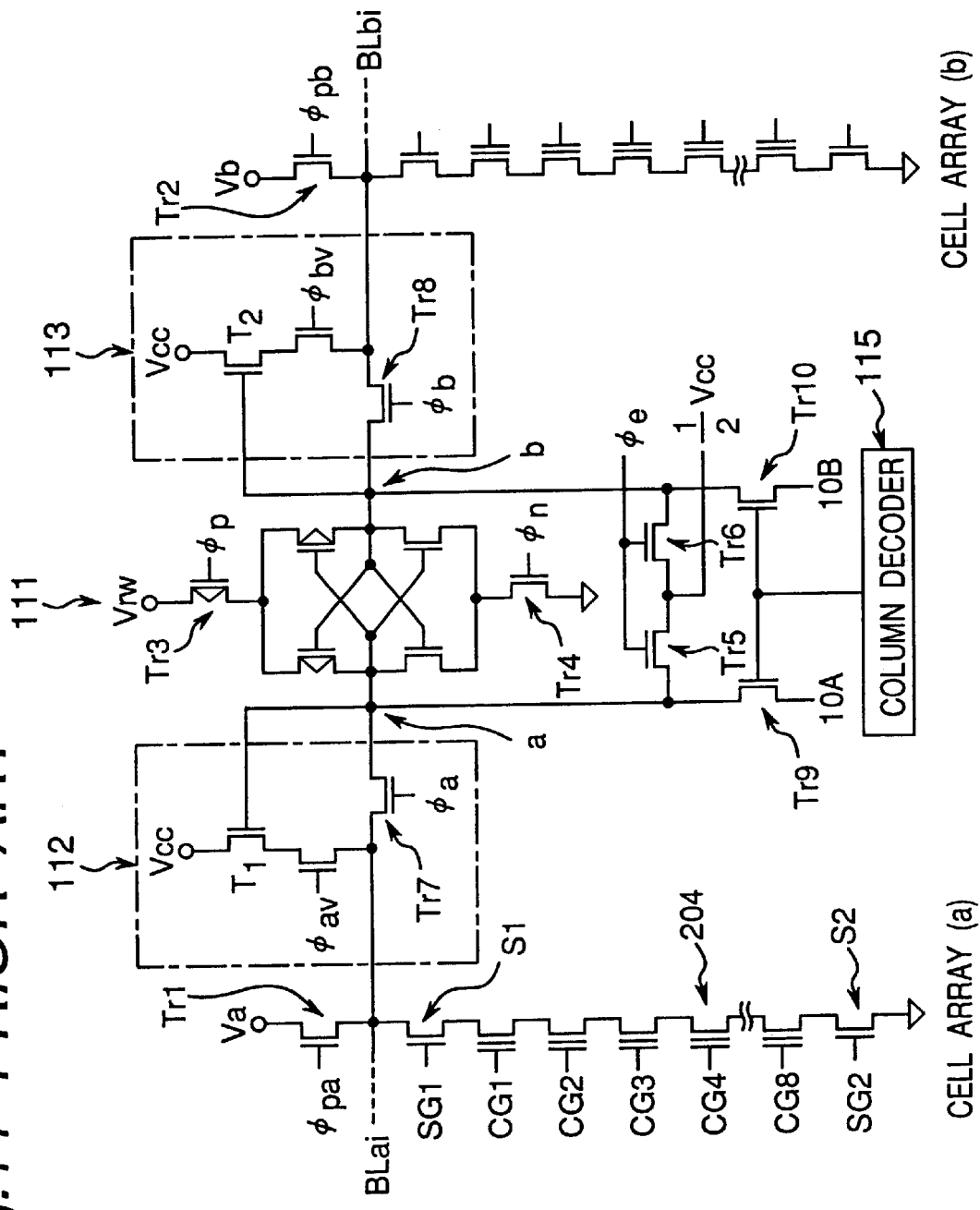
FIG. 11 is a diagram showing the structure of a rewrite circuit of a prior art NAND type flash memory.
Figure 12:
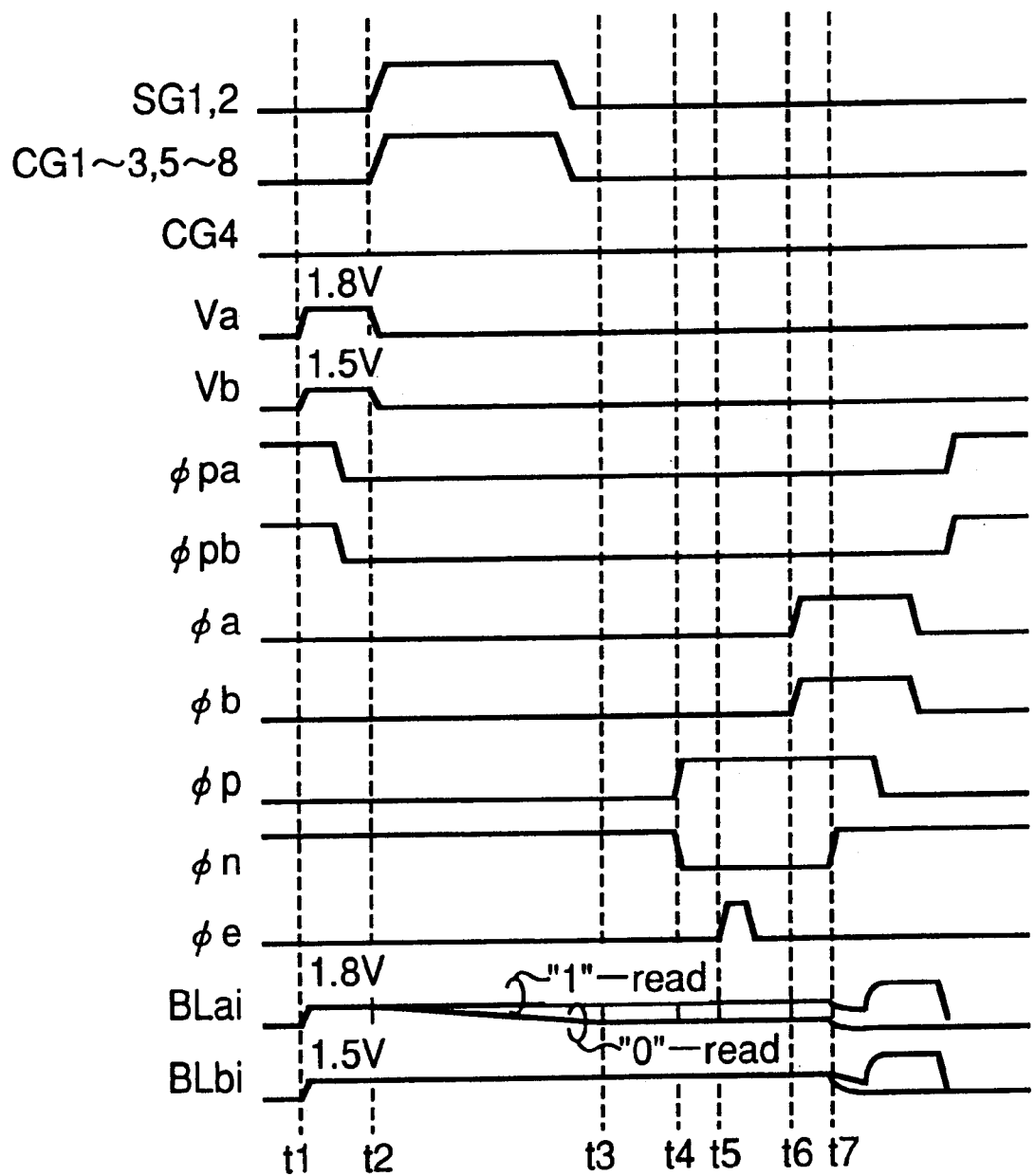
FIG. 12 is a chart showing the timing waveforms of the prior art NAND type flash memory.

Next, FIG. 10 shows the fourth embodiment. This fourth embodiment has a triple well structure. A memory cell array region 72 and a reference cell region 73 are formed on a p-substrate 71. There are further shown an n$^+$ layer 74 that forms a drain and an n$^-$layer 79 that forms a source.

According to the structure of this fourth embodiment, the memory cell array region 72 and the reference cell region 73 are separated by an n$^-$layer 75.

In this fourth embodiment, the memory cell array region 72 and the reference cell region 73 are electrically separated from each other by applying a higher voltage to the n$^-$layer 75 than that of the p-well 77 and the p-substrate 71.

The regions 72 and 73, which are enclosed and separated from each other by this n$^-$layer 75, correspond to, for example, the portions enclosed by the broken lines as the memory cell array region 1 and the reference cell region 2 in the first embodiment of FIG. 5, the second embodiment of FIG. 8 and the third embodiment of FIG. 9.

In this fourth embodiment, the memory cell array region 72 and the reference cell region 73 are electrically separated from each other. Therefore, stable high-accuracy read can be achieved without mutual disturb in operation.

Although schematically shown in the aforementioned FIG. 9, according to the construction of the third embodiment in which the reference cell is arranged for each word line, with regard to the layout in which the reference cell section 92, the memory cell array 1 and the X-decoder 6 are provided by IC (Integrated Circuit), the reference cell section 92 is arranged in a position located farthest apart from the X-decoder 6.

With the above arrangement, when increased in density and minuteness, the reference cell is delayed most at the rise time of the word line (i.e., when the memory cell is selected) due to waveform bluntness and the like ascribed to the wiring resistance and stray capacitance of the word line. For the above reasons, the variations in the memory cell characteristics of the memory cell array region can be absorbed.

It is to be noted that the present invention is limited to neither the number nor the locations of arrangement of the reference cells within a range not deviating from the essence thereof, and it is a matter of course that various modifications can be provided.

For example, in the reference cell structure of the third embodiment of FIG. 9, one reference cell is provided for each bit line, and the threshold voltage of the memory cell is preparatorily set to the specified value before the write, erase and read operations. However, there may be a structure where three reference cells (reference cell for write verify use, the reference cell for erase verify use and the reference cell for read use) which are preparatorily set the threshold voltages to the specified voltages are provided for each bit line.

For example, the control gates of the reference cell for write verify use, the reference cell for erase verify use and the reference cell for read use are connected to the word line WL0. Then, by changing the method of applying the precharge voltage to each reference cell for the removal of sneak currents between the reference cells, the aforementioned structure can be provided.

In the first, second and third embodiments of FIGS. 5, 8 and 9, the signal disa is produced by delaying the signal dis via the delay circuit delay. It is proper to set this delay time to a time during which the characteristic variations of the reference cells and the memory cells of the memory cell array or the characteristic variations between the memory cells inside the memory cell array are absorbed. For example, it is proper to set the delay time to a time during which the variations in the word line application voltage, the variations of the word line selection signal depending on the word line resistance and the stray capacitance attributed to the layout positions thereof or the like and further the variations in the memory cell read current, as described above, are absorbed. By this setting of the delay time, the read accuracy can be improved by absorbing the characteristic variations and removing the superfluous margin of the sense operation.

This delay circuit (delay) can easily be constructed by connecting, for example, inverter circuits in a multiplicity of stages in series or constructed of a capacitance, a resistance and so on. It is also acceptable to make the number of stages of the series connection of the inverter circuits switchable, for example, by providing a means for switching the number of stages by an external signal or by changing the number of stages through the disconnection of wiring by means of laser or the like, and to allow the delay time to be set taking the characteristic variations of the aforementioned memory cells into consideration after integrating them into an IC. By thus optimizing the delay time, it is enabled to improve the read accuracy, remove the superfluous (excessive) read margin and increase the speed of read.

The aforementioned embodiments have been described on the basis of the memory array of the virtual ground type taken as one example. However, the present invention is not limited to this and is allowed to be applied to a flash memory of the NOR type, the NAND type or the AND type. The aforementioned embodiments have been described on the basis of the ACT memory cell taken as one example. However, the present invention is not limited to this and is allowed to be applied to other nonvolatile memory cells.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile semiconductor storage device including a plurality of word lines and a plurality of bit lines; a memory cell array where nonvolatile memory cells each having a control gate connected to one of the plurality of word lines and a drain connected to one of the plurality of bit lines are arranged in an array form; a sense amplifier section for amplifying data read on the bit line; a precharge circuit for precharging the bit line with a specified voltage; and a reference cell whose threshold value is preparatorily set to a specified value, the nonvolatile semiconductor storage device executing data read or verify of rewrite data by precharging the bit line with the specified voltage by means of the precharge circuit, applying a specified read voltage or specified verify voltage to a selected word line and determining by means of the sense amplifier section whether or not the bit line is discharged by the selected nonvolatile memory cell, and the nonvolatile semiconductor storage device comprising:
a bit line connected to the reference cell;
a sense circuit connected to the bit line of the reference cell for detecting a timing in which discharge of the bit line of the reference cell is completed; and
a timing control means for starting sensing the reference cell concurrently with starting sensing the selected nonvolatile memory cell, causing the sense circuit to detect a timing in which discharge of the bit line of the reference cell is completed and controlling sense operation termination timing of the sense amplifier section connected to the memory cell array on the basis of the detected timing of completion.

2. A nonvolatile semiconductor storage device as claimed in claim 1, wherein
the threshold value of the reference cell is the specified value between a lower limit of a threshold voltage distribution in a state in which each nonvolatile memory cell has a high threshold value and an upper limit of a threshold voltage distribution in a state in which each nonvolatile memory cell has a low threshold value, and
the data read is executed by applying the specified read voltage to the selected word line.

3. A nonvolatile semiconductor storage device as claimed in claim 1, wherein
the threshold value of the reference cell is a write verify voltage or an erase verify voltage of the nonvolatile memory cell, and
the verify of the rewrite data is executed by applying the verify voltage to the selected word line.

4. A nonvolatile semiconductor storage device as claimed in claim 1, wherein
the nonvolatile memory cells assume at least two states with respect to threshold voltage distribution thereof, and
the threshold voltage of the reference cell is set approximately at the middle of a lower limit of a threshold voltage distribution in a state in which the threshold voltages of the nonvolatile memory cells are high and an upper limit of a threshold voltage distribution in a state in which the threshold voltages of the nonvolatile memory cells are low.

5. A nonvolatile semiconductor storage device as claimed in claim 1, wherein
the nonvolatile memory cells assume at least two states with respect to threshold voltage distribution thereof, and
the threshold voltage of the reference cell is set at upper limit of a threshold voltage distribution in a state in which the threshold voltages of the nonvolatile memory cells are low.

6. A nonvolatile semiconductor storage device as claimed in claim 1, wherein
the nonvolatile memory cells assume at least two states with respect to threshold voltage distribution thereof, and
the threshold voltage of the reference cell is set at a lower limit of a threshold voltage distribution in a state in which the threshold voltages of the nonvolatile memory cells are high.

7. A nonvolatile semiconductor storage device as claimed in claim 1, wherein
the reference cell is formed in a region that is electrically separated from the nonvolatile memory cells.

8. A nonvolatile semiconductor storage device as claimed in claim 1, wherein
a sense circuit is provided in correspondence with each of the bit lines of the nonvolatile memory cells and constructed so as to collectively read or verify the plurality of nonvolatile memory cells of which control gates are commonly connected to the same word line, and
the reference cell is provided in correspondence with each of the word lines.

9. A nonvolatile semiconductor storage device as claimed in claim 8, wherein
the reference cell is arranged farther apart from a decoder for controlling the word line than the nonvolatile memory cells.

10. A nonvolatile semiconductor storage device as claimed in claim 8, wherein
the reference cell is formed in a region that is electrically separated from the nonvolatile memory cells.

11. A nonvolatile semiconductor storage device as claimed in claim 8, wherein
the nonvolatile memory cells assume at least two states with respect to threshold voltage distribution thereof, and
the threshold voltage of the reference cell is set approximately at the middle of a lower limit of a threshold voltage distribution in a state in which the threshold voltages of the nonvolatile memory cells are high and an upper limit of a threshold voltage distribution in a state in which the threshold voltages of the nonvolatile memory cells are low.

12. A nonvolatile semiconductor storage device as claimed in claim 8, wherein
the nonvolatile memory cells assume at least two states with respect to threshold voltage distribution thereof, and
the threshold voltage of the reference cell is set at upper limit of a threshold voltage distribution in a state in which the threshold voltages of the nonvolatile memory cells are low.

13. A nonvolatile semiconductor storage device as claimed in claim 8, wherein
the nonvolatile memory cells assume at least two states with respect to threshold voltage distribution thereof, and
the threshold voltage of the reference cell is set at a lower limit of a threshold voltage distribution in a state in which the threshold voltages of the nonvolatile memory cells are high.

14. A nonvolatile semiconductor storage device as claimed in claim 1, comprising:
a delay means for delaying a signal detected by the sense circuit connected to the reference cell before using the detected signal as a sense terminate signal of the nonvolatile memory cells that constitute the memory cell array.

* * * * *